United States Patent
Ohkoshi et al.

(10) Patent No.: US 8,609,261 B2
(45) Date of Patent: * Dec. 17, 2013

(54) TITANIUM OXIDE PARTICLES, MANUFACTURING METHOD THEREOF, MAGNETIC MEMORY, AND CHARGE STORAGE TYPE MEMORY

(75) Inventors: Shin-ichi Ohkoshi, Tokyo (JP); Tomoyuki Matsuda, Tokyo (JP); Yoshihide Tsunobuchi, Tokyo (JP); Kazuhito Hashimoto, Tokyo (JP); Hiroko Tokoro, Tokyo (JP)

(73) Assignee: The University of Tokyo, Tokyo (JP)

( * ) Notice: Subject to any disclaimer, the term of this patent is extended or adjusted under 35 U.S.C. 154(b) by 128 days.

This patent is subject to a terminal disclaimer.

(21) Appl. No.: 13/127,175

(22) PCT Filed: Nov. 26, 2009

(86) PCT No.: PCT/JP2009/069973
§ 371 (c)(1),
(2), (4) Date: May 2, 2011

(87) PCT Pub. No.: WO2010/064575
PCT Pub. Date: Jun. 10, 2010

(65) Prior Publication Data
US 2011/0204278 A1    Aug. 25, 2011

(30) Foreign Application Priority Data

Dec. 4, 2008    (JP) ................. 2008-309378

(51) Int. Cl.
    *C01G 23/04*    (2006.01)
(52) U.S. Cl.
    CPC ..................... *C01G 23/04* (2013.01)
    USPC .......... 428/800; 428/826; 428/64.4; 428/323; 428/402; 252/62.51 R; 423/608

(58) Field of Classification Search
    None
    See application file for complete search history.

(56) References Cited

U.S. PATENT DOCUMENTS

| 3,502,460 A | 3/1970 | Martin et al. |
| 6,866,710 B2 * | 3/2005 | Heider et al. ................ 106/403 |
| 2003/0161257 A1 | 8/2003 | Yusu et al. |
| 2008/0170483 A1 | 7/2008 | Kim |
| 2010/0216279 A1 * | 8/2010 | Lai et al. ...................... 438/104 |

FOREIGN PATENT DOCUMENTS

| EP | 1 431 351 A1 | 6/2004 |
| JP | 61-146714 A | 7/1986 |
| JP | 5-009028 A | 1/1993 |

(Continued)

OTHER PUBLICATIONS

Zheng, Liaoying (Sens and Act. B, 88 (2003), 115-119).*

(Continued)

*Primary Examiner* — Kevin Bernatz
(74) *Attorney, Agent, or Firm* — Westerman, Hattori, Daniels & Adrian, LLP

(57) ABSTRACT

There are provided titanium oxide particles capable of manifesting an unprecedented property, a manufacturing method thereof and a magnetic memory as well as a charge storage type memory employing the titanium oxide particles. Unlike-conventional bulk bodies phase-transited between nonmagnetic semiconductors and paramagnetic metals around about 460K, provided are titanium oxide particles 3 capable of manifesting an unprecedented property that $Ti_3O_5$ particles do not undergo phase transitions at room temperature and allow a paramagnetic metal property thereof to be consistently maintained in any temperature range.

11 Claims, 12 Drawing Sheets

(56) References Cited

FOREIGN PATENT DOCUMENTS

| JP | 05-238734 A | 9/1993 |
|---|---|---|
| JP | 10-177714 A | 6/1998 |
| JP | 2003-238156 A | 8/2003 |
| JP | 2005-120470 A | 5/2005 |
| JP | 2008-050208 A | 3/2008 |

OTHER PUBLICATIONS

Zheng, et al., "The preparation and oxygen-sensing properties of α-Ti3O5 thin film", Sensors and Actuators B: Chemical: International Journal Devoted to Research and Development of Physical and Chemical Transducers, dated Jan. 15, 2003, vol. 88, No. 2, pp. 115-119, XP004399079. Cited in Extended European Search Report dated May 7, 2012.

Kellerman, et al., "Magnetic Susceptibility of Ti3-xZrxO5 (0 ≤x≤ 0.25)", Inorganic Materials dated Feb. 1, 1983, vol. 19, No. 2, pp. 218-221, XP008151159. Cited in Extended European Search Report dated May 7, 2012.

Keys, et al., "Magnetic Studies of Ti3O5", Physics Letters, dated Jun. 5, 1967, vol. 24, No. 12, pp. 628-630, XP022565880. Cited in Extended European Search Report dated May 7, 2012.

Onoda, et al., "Phase Transitions and the doping effect in Ti3O5", Journal of Physics: Condensed Matter, dated 1998, vol. 10, pp. 7003-7013, XP002674382. Cited in Extended European Search Report dated May 7, 2012.

Onoda, "Phase Transitions of Ti3O5", Journal of Solid State Chemistry, dated 1998, vol. 136, pp. 67-73, XP002674383. Cited in Extended European Search Report dated May 7, 2012.

Hyett, et al., "The Use of Combinatorial Chemical Vapor Deposition in the Synthesis of Ti3-∂O4N, with 0.06 <∂ < 0.25: A Titanium Oxynitride Phase Isostructural to Anosovite", Journal of the American Chemical Society, vol. 129, Nov. 2007, pp. 15541-15548, XP002674381. Cited in Extended European Search Report dated May 7, 2012.

Extended European Search Report dated May 7, 2012, issued in corresponding European Patent Application No. 09830342.3, (10 pages).

C. Hauf et al., "Preparation of various titanium suboxide powders by reduction of TiO2 with silicon", Journal of Materials Science, Mar. 15, 1999, vol. 34, No. 6, pp. 1287-1292, cited in ISR.

Hitoshi Sato et al., "Ti 3d Orbital Change Across Metal-Insulator Transition in Ti2O3: Polarization-Dependent Soft X-ray Absorption Spectroscopy at Ti 2p Edge", Journal of the Physical Society of Japan vol. 75, No. 5, May 2006, pp. 053702/1-4, cited in spec.

International Search Report of PCT/JP2009/069973, date of mailing Mar. 2, 2010.

Office Action of U.S. Appl. No. 13/131,688 dated Mar. 13, 2013.

Supplementary European Search Report dated May 3, 2012, issued in related European Patent Application No. 09834572.1.

International Search Report of PCT/JP2009/062677 mailed on Aug. 11, 2009. (w/English Translation).

\* cited by examiner

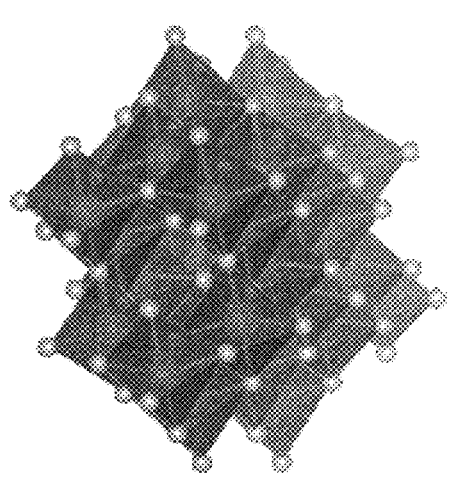
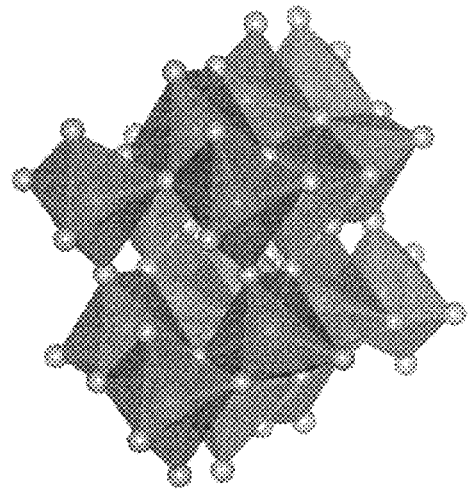
Monoclinic crystal C2/m
$a$ = 9.835(1) Å
$b$ = 3.794(1) Å
$c$ = 9.9824(9) Å
$\beta$ = 90.720(9)°
$d$ = 3.988 g/cm³
FIG.2A
Orthorhombic crystal Cmcm
$a$ = 3.798(2) Å
$b$ = 9.846(3) Å
$c$ = 9.988(4) Å
$d$ = 3.977 g/cm³
FIG.2B

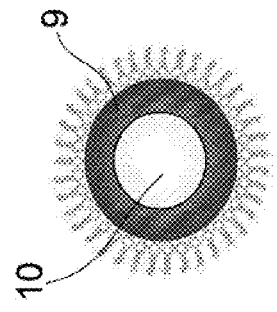
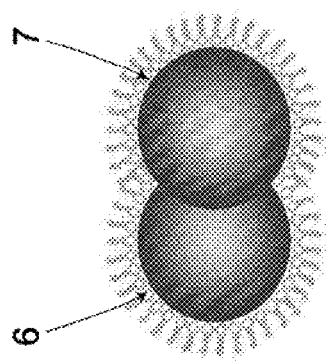
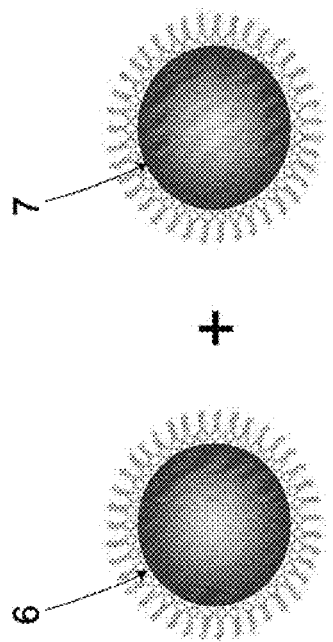
FIG.3A  FIG.3B  FIG.3C
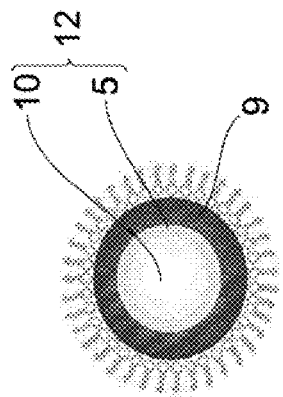
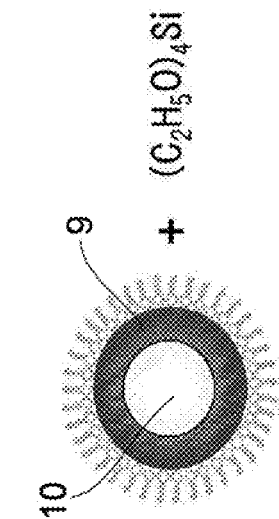
FIG.3D  FIG.3E Particle diameter 5nm Monoclinic crystal C2/m
$a = 9.748(1)$ Å
$b = 3.8013(4)$ Å
$c = 9.4405(7)$ Å
$\beta = 91.529(7)°$
$d = 4.249$ g/cm³

US 8,609,261 B2

TITANIUM OXIDE PARTICLES, MANUFACTURING METHOD THEREOF, MAGNETIC MEMORY, AND CHARGE STORAGE TYPE MEMORY

TECHNICAL FIELD

The present invention relates to titanium oxide particles, a manufacturing method thereof and a magnetic memory as well as a charge storage type memory, and may be applied to, for example, an oxide containing $Ti^{3+}$ (simply referred to as titanium oxide, hereunder).

BACKGROUND ART

For example, $Ti_2O_3$, as a typical example of titanium oxides, is a phase-transition material having various interesting properties such as the metal-insulator transition and the paramagnetic-antiferromagnetic transition. Further, $Ti_2O_3$ is also known for its infrared absorption property, thermoelectric effect, magnetoelectric (ME) effect, etc, and magnetoresistance (MR) effect as has been found out in recent years. Those properties have only been studied with bulk bodies (~μm size) (e.g., nonpatent document 1), and have not yet been vastly clear in terms of the mechanisms thereof.

Nonpatent document 1: Hitoshi SATO, et al., JOURNAL OF THE PHYSICAL SOCIETY OF JAPAN Vol.75, No.5, May 2006, pp. 053702/1-4

DISCLOSURE OF THE INVENTION

Problem to be Solved by the Invention

Here, according to the conventional synthesis methods of titanium oxides, they have heretofore been synthesized as bulk bodies through baking treatment in vacuum at about 1600° C., carbon reduction of $TiO_2$ at about 700° C., or baking treatment on $TiO_2$, $H_2$, $TiCl_4$ at about 1000° C. Further, there has not yet been reported a case involving nano particles (nm size) of $TiO_x$ containing $Ti^{3+}$. In this sense, manifestation of a new property is expected by forming the same into nanoparticles.

In view of the aforementioned problem, it is an object of the present invention to provide titanium oxide particles capable of manifesting an unprecedented property, a manufacturing method thereof, and a magnetic memory as well as a charge storage type memory employing such titanium oxide particles.

Means for Solving the Problem

The invention according to a first aspect is composed of nanosized $Ti_3O_5$ particles comprised of $Ti_3O_5$, and maintaining a paramagnetic metal state in a temperature range of 0-800K.

Further, according to the invention described in a second aspect, the $Ti_3O_5$ particles form an orthorhombic crystal structure in the paramagnetic metal state within a temperature range not less than 500K, and a monoclinic crystal structure in the paramagnetic metal state within a temperature range not more than 300K.

Furthermore, according to the invention described in a third aspect, surfaces of the $Ti_3O_5$ particles are coated with silica.

Furthermore, according to the invention described in a fourth aspect, a silane compound is added to a mixed solution prepared by mixing a feed micellar solution in which an aqueous phase containing titanium chloride is within an oil phase with a neutralizer micellar solution in which an aqueous phase containing a neutralizer is within an oil phase, thereby producing silica-coated titanium hydroxide compound particles obtained by allowing surfaces of titanium hydroxide compound particles in the mixed solution to be coated with silica. The silica-coated titanium hydroxide compound particles are then subjected to baking treatment at a given temperature after being separated from the mixed solution, thus obtaining the $Ti_3O_5$ particles.

Furthermore, the invention according to a fifth aspect comprises: a step for producing the titanium hydroxide compound particles in the mixed solution prepared by mixing the feed micellar solution in which the aqueous phase containing titanium chloride is within an oil phase with the neutralizer micellar solution in which the aqueous phase containing the neutralizer is within an oil phase; a step for producing the silica-coated titanium hydroxide compound particles obtained by allowing surfaces of the titanium hydroxide compound particles to be coated with silica, by adding the silane compound to the mixed solution; and a step for manufacturing titanium oxide particles composed of the $Ti_3O_5$ particles whose surface are coated with silica, by separating the silica-coated titanium hydroxide compound particles from the mixed solution, and then subjecting the silica-coated titanium hydroxide compound particles thus separated to baking treatment at the given temperature.

Furthermore, the invention according to a sixth aspect comprises a magnetic layer formed by fixing magnetic materials on a supporting body, such magnetic materials being provided by using the titanium oxide particles described in any one of the first aspect through the fourth aspect.

Furthermore, the invention according to a seventh aspect comprises a charge storage layer formed by fixing charge storage materials on a supporting body, such charge storage materials being provided by using the titanium oxide particles described in any one of the first aspect through the fourth aspect.

Effects of the Invention

According to the first aspect and the fifth aspect of the present invention, there can be provided titanium oxide particles capable of manifesting an unprecedented property.

Further, according to the sixth aspect of the present invention, there can be provided a magnetic memory employing the titanium oxide particles capable of manifesting an unprecedented property as magnetic materials.

Furthermore, according to the seventh aspect of the present invention, there can be provided a charge storage type memory employing the titanium oxide particles capable of manifesting an unprecedented property as charge storage materials.

BRIEF DESCRIPTION OF THE DRAWINGS

FIG. 2 is a schematic view showing a crystal structure of $\lambda$-$Ti_3O_5$ and a crystal structure of $\alpha$-$Ti_3O_5$.

FIG. 3 is a diagram describing how silica-coated titanium hydroxide compound particles are produced.

BEST MODE FOR CARRYING OUT THE INVENTION

Best modes for carrying out the present invention are described hereunder.

(1) Structures of Titanium Oxide Particles

Figure 1:
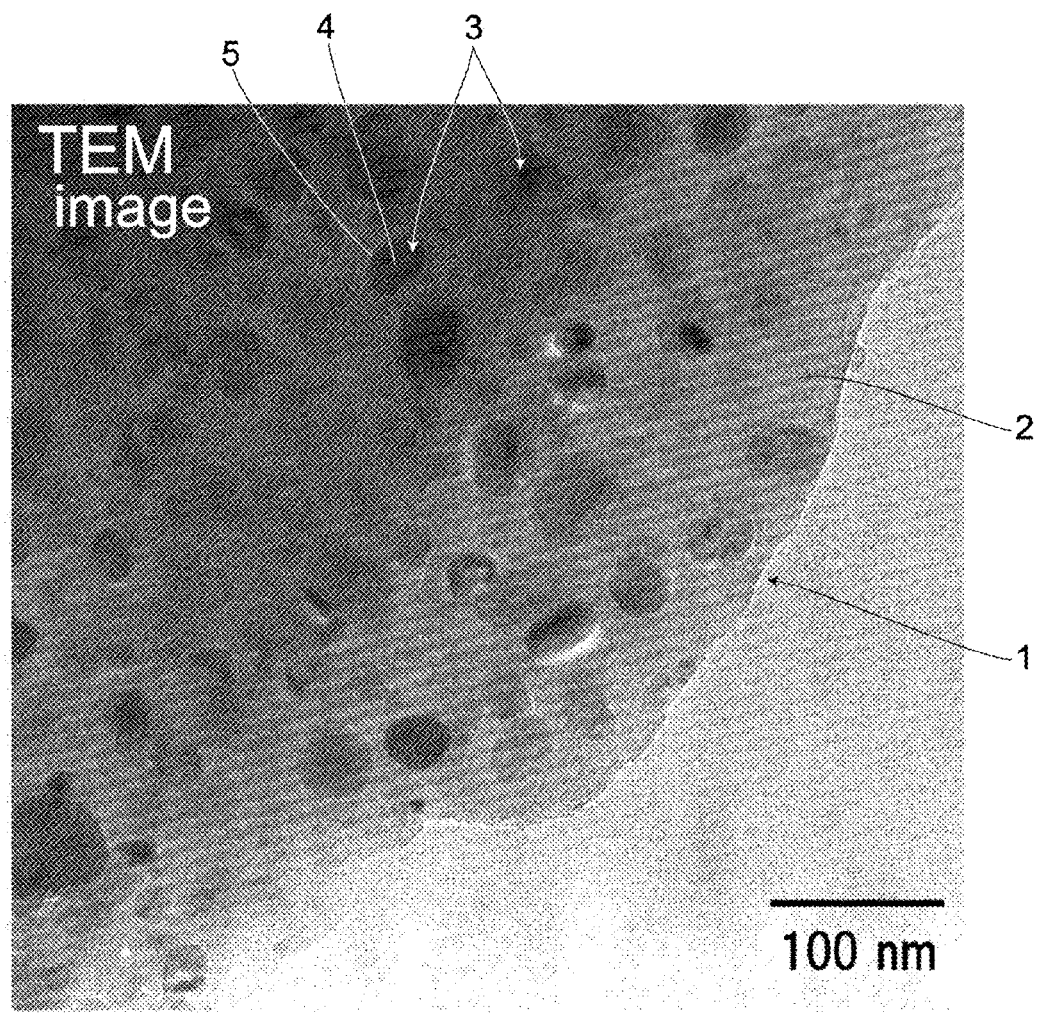
FIG. 1 is a TEM image showing a structure of a fine-particle structural body composed of titanium oxide particles of the present invention.

FIG. 1 is a TEM image obtained by photographing a fine-particle structural body 1 with a transmission electron microscope (TEM). Such fine-particle structural body 1 is composed of nanosized titanium oxide particles 3 having particle diameters of, for example, about 10-35 nm dispersed in a silica glass 2 of an amorphous structure.

In fact, such titanium oxide particles 3 of the present invention are composed of $Ti_3O_5$ particles 4 comprised of $Ti_3O_5$ in the pseudo-brookite structure, and $SiO_2$ (silica) 5 coating surfaces of the $Ti_3O_5$ particles 4. Here, crystal structures of the $Ti_3O_5$ particles 4 are allowed to undergo phase transitions as the temperature changes. Also, the $Ti_3O_5$ particles 4 manifest Pauli paramagnetism in all temperature ranges (e.g., a temperature range of 0-800K), and thus allow the paramagnetic metal state thereof to be maintained.

Namely, the titanium oxide particles 3 of the present invention are unprecedentedly unique in that the paramagnetic metal state thereof can be maintained even in a temperature range below about 460K within which conventionally-known bulk bodies comprised of $Ti_3O_5$ (referred to as conventional crystals, hereunder) are phase-transited to nonmagnetic semiconductors.

In fact, within a temperature range equal to or lower than 300K, the $Ti_3O_5$ particles 4 allow the crystal structures thereof to become those in a monoclinic crystal phase (also referred to as λ phase, hereunder) in which the paramagnetic metal state of $Ti_3O_5$ is maintained. Further, the $Ti_3O_5$ particles 4 start undergoing phase transitions once the temperature has exceeded about 300K, thus allowing the crystal structures thereof to be in a multiphase state where both λ phase and orthorhombic α phase in the paramagnetic metal state exist. Furthermore, only the crystal structures in α phase can be observed within a temperature range above about 500K.

According to this example and as shown in FIG. 2(A), within the temperature range equal to or lower than about 300K, the crystal structures of the $Ti_3O_5$ particles 4 can become those of $Ti_3O_5$ (referred to as λ-$Ti_3O_5$, hereunder) belonging to a space group C2/m, having lattice constants which are a=9.835 (1) Å, b=3.794 (1) Å, c=9.9824 (9) Å, β=90.720 (9)°, and having a density of unit cell of d=3.988 g/cm³. On the other hand, within a temperature range equal to or higher than about 500K, the crystal structures of the $Ti_3O_5$ particles 4 can become those of α-$Ti_3O_5$ belonging to a space group Cmcm, and having lattice constants which are a=3.798 (2) Å, b=9.846 (3) Å, c=9.988 (4) Å, d=3.977 g/cm³.

(2) Manufacturing Method of Titanium Oxide Particles

A method of manufacturing the titanium oxide particles 3 is described hereunder. The titanium oxide particles 3 of the present invention can be manufactured by combining the reverse-micelle method and the sol-gel method in a hereinbelow-described manner. Specifically, at first, a surfactant (e.g., cetyltrimethylammonium bromide (CTAB ($C_{16}H_{33}N$ ($CH_3$) $_3Br$))) is dissolved in a solution having an oil phase comprised of octane and 1-butanol, while titanium chloride is added and dissolved therein.

In this way, as shown in FIG. 3A, there is prepared a feed micellar solution in which an aqueous phase 6 containing titanium chloride is within an oil phase. Here, titanium tetrachloride ($TiCl_4$) can be employed as titanium chloride.

Further, other than preparing the feed micellar solution, the surfactant (e.g., cetyltrimethylammonium bromide (CTAB ($C_{16}H_{33}N$ ($CH_3$) $_3Br$))) is dissolved in the solution having the oil phase comprised of octane and 1-butanol, and a neutralizer is mixed therein.

In this way, as shown in FIG. 3A, there is prepared a neutralizer micellar solution in which an aqueous phase 7 containing ammonia ($NH_3$) is within an oil phase. Here, an ammonia aqueous solution can be employed as the neutralizer.

Next, there is prepared a mixed solution according to the reverse-micelle method, by stirring and mixing together the feed micellar solution and the neutralizer micellar solution. At that time, a hydroxylation reaction takes place in the aqueous phases, thus obtaining, within an aqueous phase 9 of the mixed solution, titanium hydroxide compound particles 10 comprised of Ti $(OH)_4$, as shown in FIG. 3B and FIG. 3C.

Next, according to the sol-gel method and as shown in FIG.3D, there is appropriately added to the mixed solution a solution of a silane compound such as tetraethoxysilane (TEOS (($C_2H_5O)_4Si$) or the like. In this way, a hydrolysis reaction takes place in the mixed solution, thus obtaining, after 24 hours, for example, silica-coated titanium hydroxide compound particles 12 composed of the titanium hydroxide compound particles 10 whose surfaces are coated with silica 5, as shown in FIG.3E.

Figure 4:
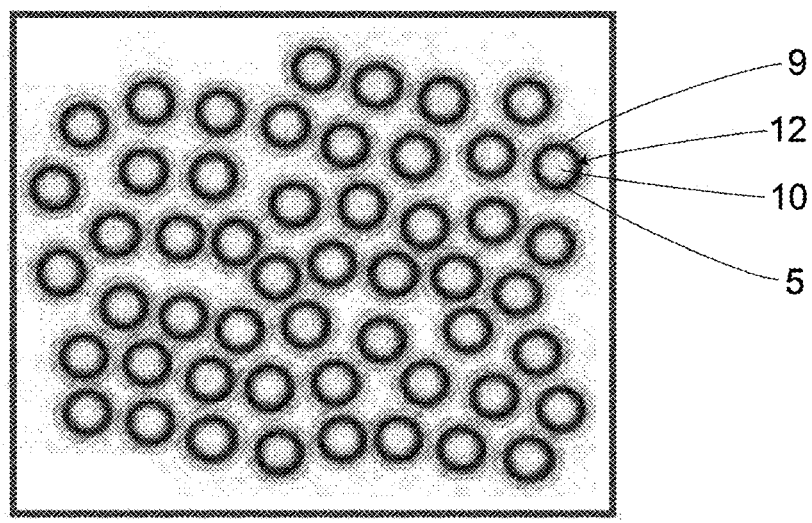
FIG. 4 is a schematic view showing a structure of the silica-coated titanium hydroxide compound particles.
Figure 5:
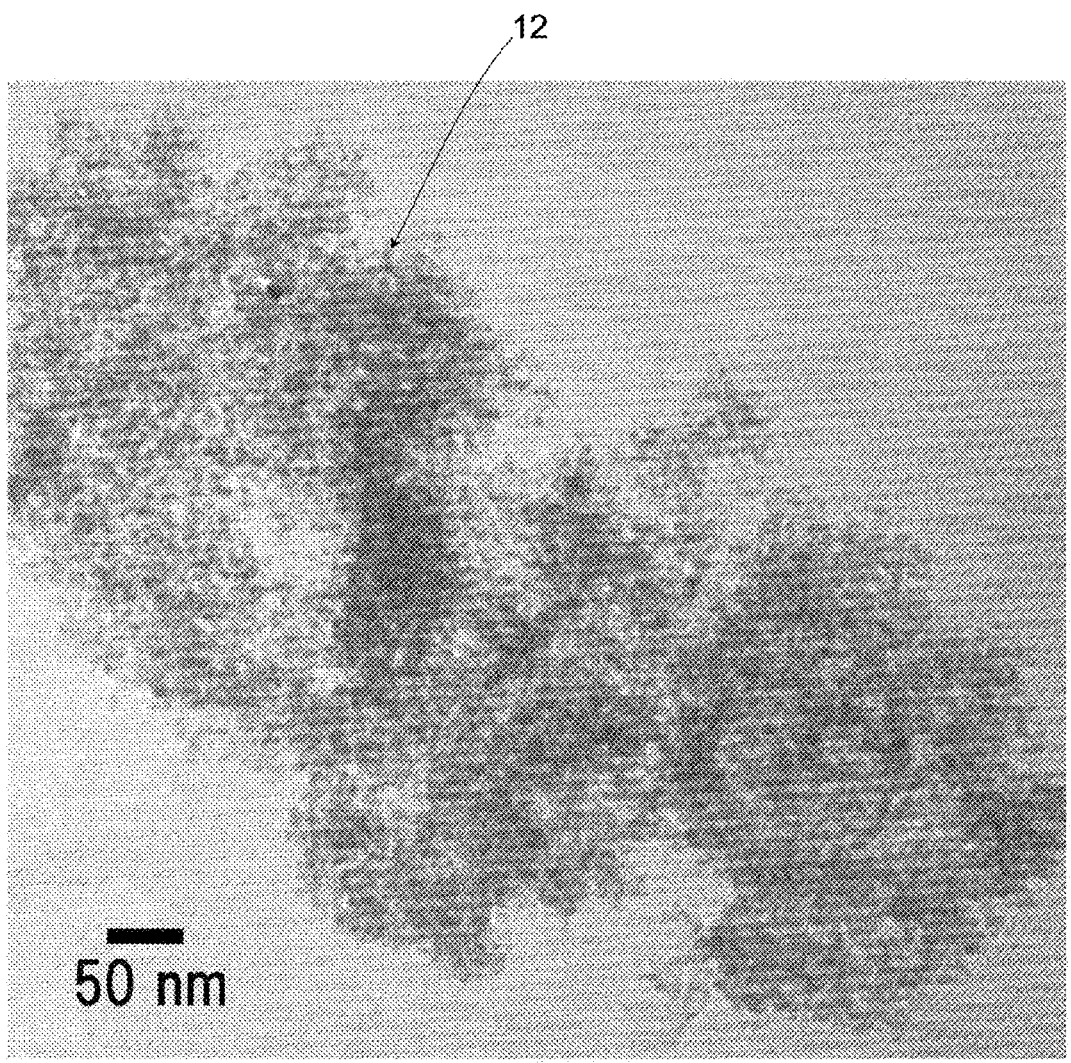
FIG. 5 is a TEM image showing the structure of the silica-coated titanium hydroxide compound particles.

Next, the silica-coated titanium hydroxide compound particles 12 are separated from the mixed solution using centrifugal separation, followed by washing and drying the silica-coated titanium hydroxide compound particles 12 thus separated. In this way, the silica-coated titanium hydroxide compound particles 12 (Ti $(OH)_4$ fine particles coated with silica) as shown in FIG. 4 are extracted from the mixed solution. Here, a TEM image as shown in FIG. 5 is obtained by photographing the silica-coated titanium hydroxide compound particles 12 thus dried, using the transmission electron microscope (TEM). According to this TEM image, it is confirmed that the silica-coated titanium hydroxide compound particles 12 are fine particles with diameters of about 5 nm.

Next, the silica-coated titanium hydroxide compound particles 12 thus dried (Ti $(OH)_4$ fine particles coated with silica) are subjected to baking treatment for a given period of time (about five hours), in a hydrogen atmosphere (0.5 L/min) and at a given temperature (about 1200° C.). Due to such baking treatment, an oxidation reaction takes place inside silica shells of the silica-coated titanium hydroxide compound particles 12, thus obtaining, inside the silica 5, $Ti_3O_5$ ($Ti^{3+}_2Ti^{4+}O_5$) particles that are oxides containing $Ti^{3+}$ resulting from reduction of $Ti^{4+}$. In this way, there can be manufactured the titanium oxide particles 3 composed of the $Ti_3O_5$ particles 4 whose surfaces are coated with the silica 5, and the $Ti_3O_5$ particles 4 turned into either λ phase or α phase depending on change in temperature. In addition, coating with the silica 5 can help prevent the particles from being sintered with one another.

(3) Experimental Result

The titanium oxide particles 3 of the present invention manufactured according to the aforementioned manufacturing method were found to have the following features through experiments.

(3-1) X-Ray Diffraction (XRD) Measurement of λ-$Ti_3O_5$

Figure 6:
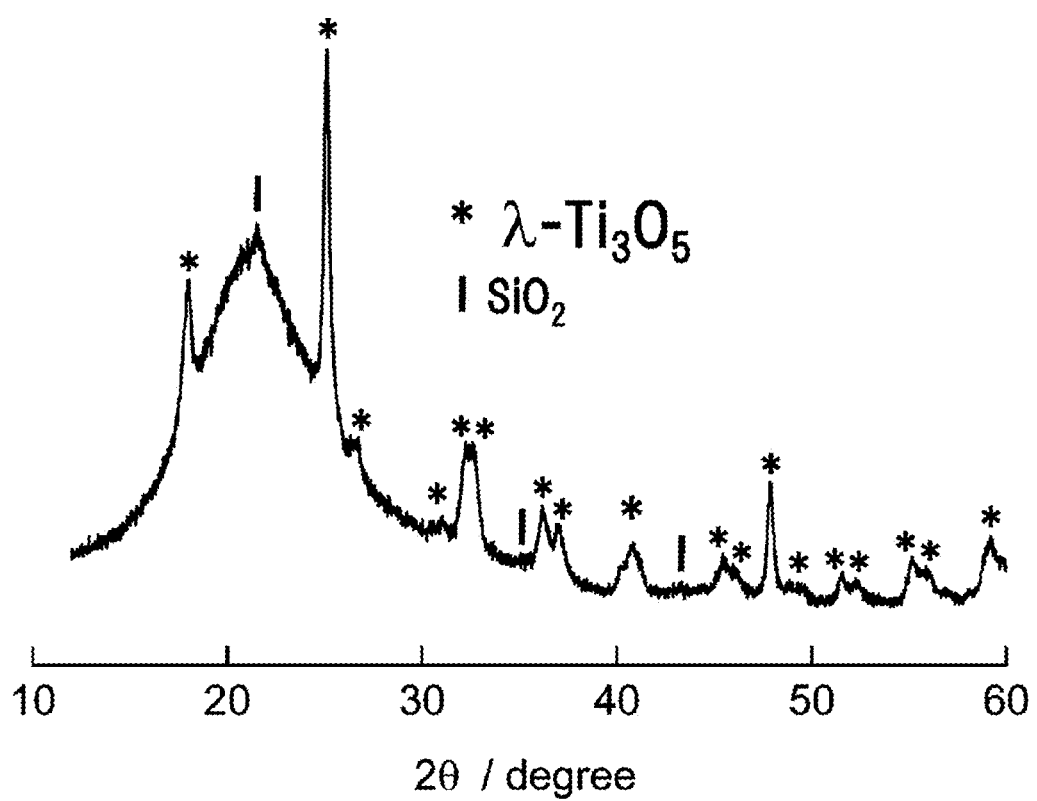
FIG. 6 is a graph showing an analysis result of an XRD pattern of the titanium oxide particles.

XRD measurement of the titanium oxide particles 3 was performed within a temperature range of 0 to 300K in which crystal structures of the titanium oxide particles 3 became λ-$Ti_3O_5$. Here, FIG. 6 shows an analysis result of an XRD pattern of the titanium oxide particles 3, in which a horizontal axis represents diffraction angles, while a vertical axis represents diffraction X-ray intensities. As shown in FIG. 6, since peaks indicating $SiO_2$ (silica) were observed in the XRD pattern, it was confirmed that the titanium oxide particles 3 had the silica 5. Further, since the locations of the peaks particular to the titanium oxide particles 3 in the XRD pattern were different from those in an XRD pattern of α-$Ti_3O_5$ (not shown), it was confirmed that the crystal structures of the titanium oxide particles 3 were not α-$Ti_3O_5$.

Figure 7:
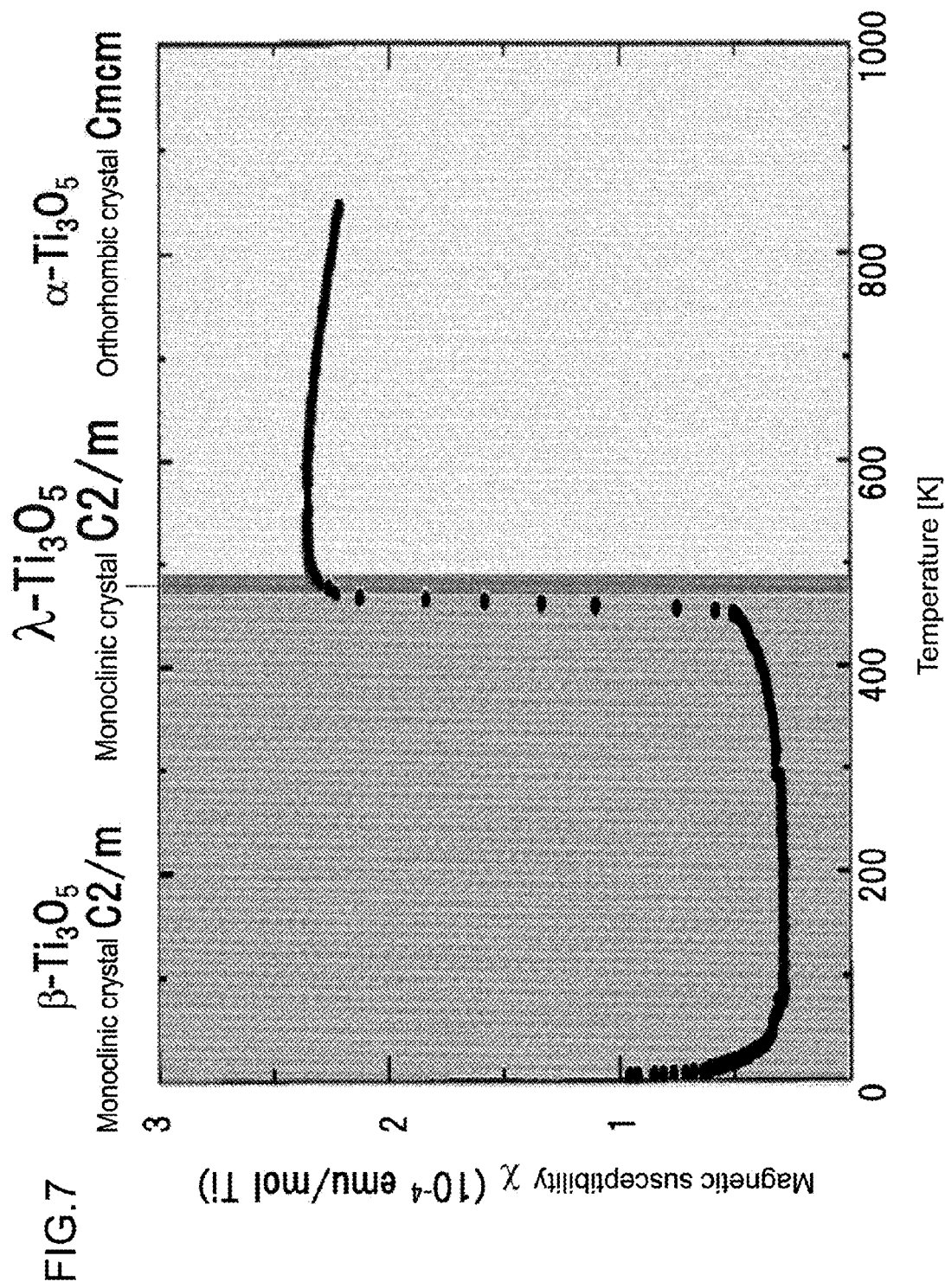
FIG. 7 is a graph showing a correlation between magnetic susceptibility and temperature with respect to conventional bulk bodies.
Figure 8:
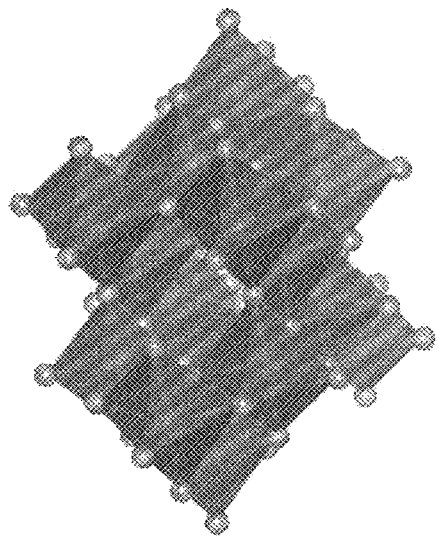
FIG. 8 is a schematic view showing a crystal structure of β-$Ti_3O_5$.

Meanwhile, as shown in FIG. 7, the conventional crystals are phase-transition substances whose crystal structures, as has been confirmed, become α-$Ti_3O_5$ when the temperature is higher than about 460K, and β-$Ti_3O_5$ when the temperature is lower than about 460K. Here, the conventional crystals turned into β phase within the temperature range of below about 460K have monoclinic crystal structures, and are slightly magnetized, but become nonmagnetic ions and nonmagnetic semiconductors accordingly. Particularly, as shown in FIG. 8, the conventional crystals within the temperature range below about 460K have crystal structures of β-$Ti_3O_5$ belonging to the space group C2/m and having lattice constants which are a=9.748 (1) Å, b=3.8013 (4) Å, c=9.4405 (7) Å, β=91.529 (7)° and d=4.249 g/cm$^3$. In this sense, it is evident that λ-$Ti_3O_5$ of the titanium oxide particles 3 of the present invention is different from β-$Ti_3O_5$ even in terms of crystal structures.

Further, it has been confirmed that the conventional crystals within a significantly narrow temperature range around about 460K became crystal structural bodies of neither a phase nor β phase. An XRD pattern of such crystal structural bodies was then analyzed, and the peaks particular to the corresponding XRD pattern were marked with "*" in FIG. 6. As shown in FIG. 6, it was confirmed that those peaks were significantly identical to the peaks in the XRD pattern of λ-$Ti_3O_5$ of the present invention. In this sense, it became evident that the crystal structures of the titanium oxide particles 3 of the present invention are allowed to stably become λ-$Ti_3O_5$ within the wide temperature range of about 0-300K, as compared to the conventional crystals whose crystal structures are allowed to become λ-$Ti_3O_5$ only within the significantly narrow temperature range around about 460K.

(3-2) Temperature Dependence of λ Phase and a Phase of Titanium Oxide Particles

Figure 9:
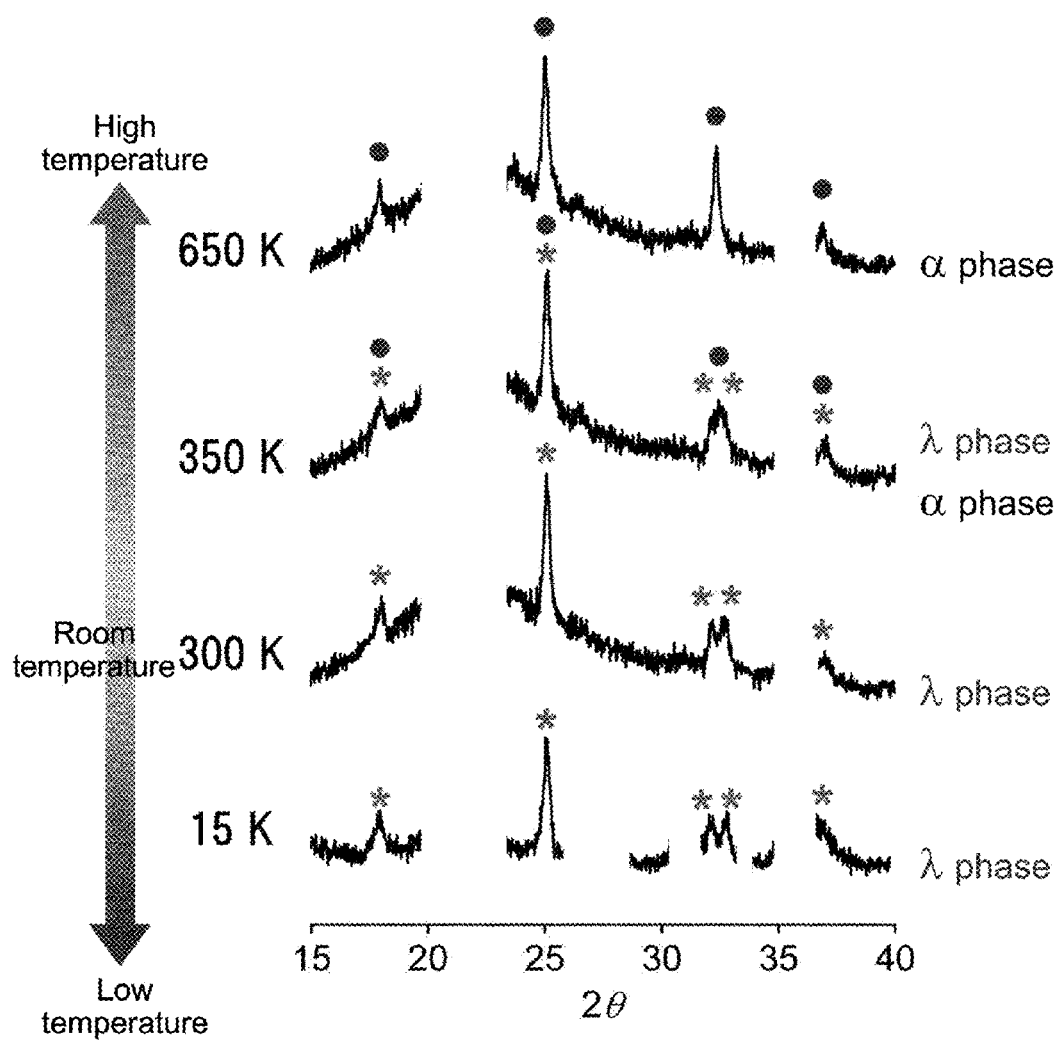
FIG. 9 is a graph showing an analysis result of XRD patterns of the titanium oxide particles at temperatures of 15K, 300K, 350K and 650K, respectively.

XRD measurements were performed on the titanium oxide particles 3 at temperatures of 15K, 300K, 350K and 650K, respectively. In this way, an analysis result of XRD patterns as shown in FIG. 9 was obtained. According to an XRD pattern of the titanium oxide particles 3 at the temperature of 15K, since there were observed peaks similar to those in an XRD pattern of the titanium oxide particles 3 at the temperature of 300K, it was confirmed that the crystal phases were still λ phase.

According to an XRD pattern of the titanium oxide particles 3 at the temperature of 350K, since there were observed both peaks similar to those in the XRD pattern of the titanium oxide particle 3 at the temperature of 300K, and peaks similar to those in an XRD pattern of α phase, it was confirmed that the crystal phase was a mixed phase of λ phase and α phase. Further, according to an XRD pattern of the titanium oxide particles 3 at the temperature of 650K, since there were only observed peaks similar to those in the XRD pattern of α phase, it was confirmed that the crystal phases were only composed of α phase.

Figure 10:
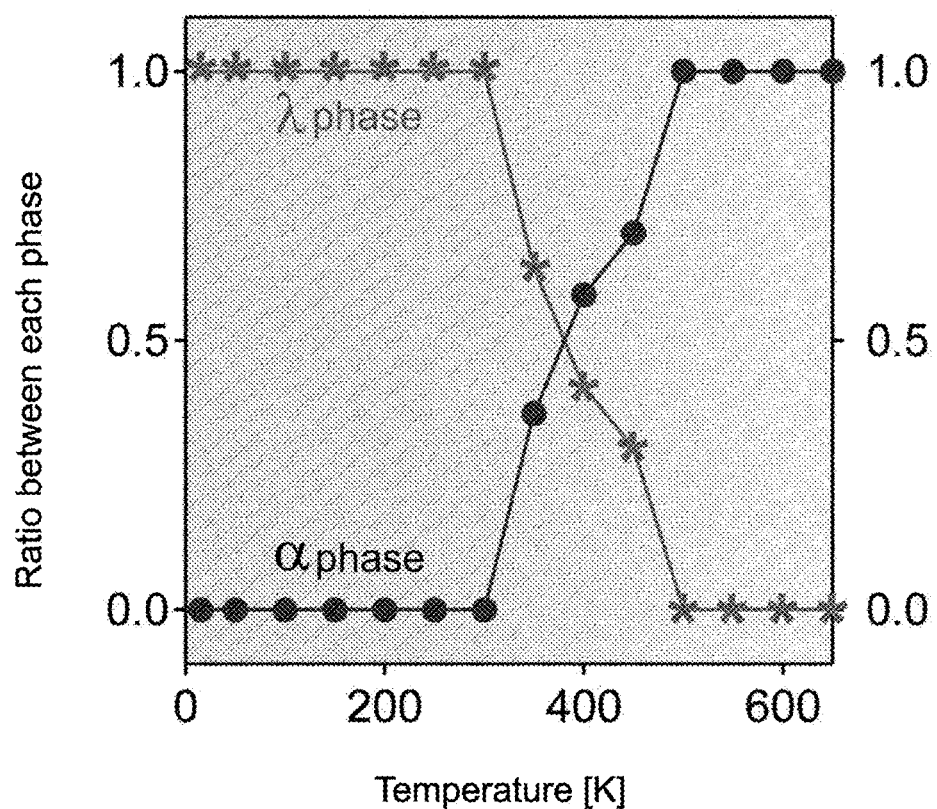
FIG. 10 is a graph showing a correlation between a ratio between α phase and λ phase, and temperature with respect to the titanium oxide particles.

Here, with regard to the titanium oxide particles 3 of the present invention, ratios between α phase and λ phase within a temperature range of 0-650K were studied based on the diffraction X-ray intensities of the XRD patterns, and there were obtained results shown in FIG. 10. As shown in FIG. 10, it was confirmed that the crystal phases of the titanium oxide particles 3 were only composed of λ phase within the temperature range equal to or lower than about 300K. Further, with regard to the titanium oxide particles 3, it became evident that once the temperature had exceeded about 300K, α phase started to become present. Gradually, there were observed more a phases but less λ phases as the temperature increased. Furthermore, there were observed more a phases than λ phases as the temperature had reached about 400K, and was observed thereafter the mixed phase of λ phase and α phase before the temperature had reached about 500K. Furthermore, it became evident that the crystal phases of the titanium oxide particles 3 were only composed of α phase within the temperature range equal to or higher than about 500K. In this sense, it was confirmed that the crystal phases of the titanium oxide particles 3 of the present invention were composed of λ phase within a wide temperature range higher than or equal to 0 but lower than 500K. In addition, there was also confirmed the temperature dependence of λ phase and α phase.

(3-3) Magnetic Property of Titanium Oxide Particles

Figure 11:
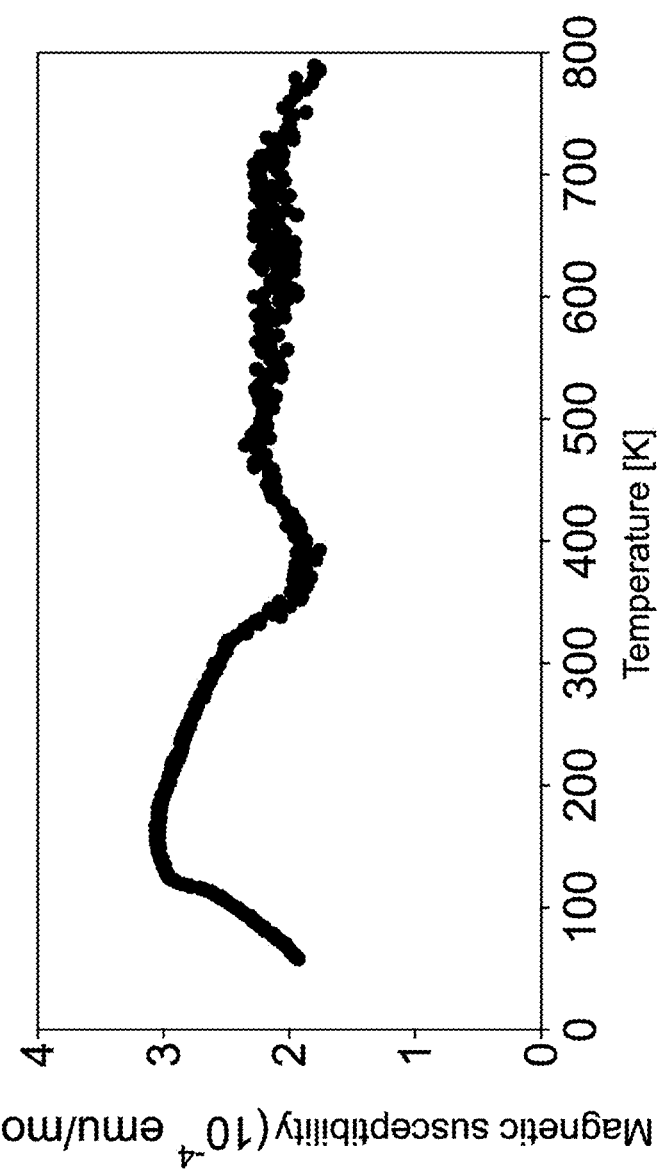
FIG. 11 is a graph showing a correlation between magnetic susceptibility and temperature with respect to the titanium oxide particles.

Next, studies were made on a magnetic property of the titanium oxide particles 3 when the temperature was changed. Particularly, magnetic susceptibilities of the titanium oxide particles 3 were measured using a magnetic fluxmeter employing SQUID (Superconducting Quantum Interference Device). In this way, there were obtained results as shown in FIG. 11. According to FIG. 11, the titanium oxide particles 3 were Pauli-paramagnetic in all temperature ranges of 0-800K. In this sense, it became evident that the paramagnetic metal state of the titanium oxide particles 3 was maintained.

In this way, unlike the conventionally-known bulk bodies having $Ti^{3+}$ (FIG. 7), the crystal structures of the titanium oxide particles 3 were not phase-transited to β-$Ti_3O_5$ around 460K, but found to keep exhibiting a paramagnetic metal property similar to that of α-$Ti_3O_5$ in all temperature ranges.

(4) Operations and Effects

With regard to the aforementioned structure, the manufacturing method according to the present invention comprises: preparing the feed micellar solution in which the aqueous phase 6 containing titanium chloride is within an oil phase; preparing the neutralizer micellar solution in which the aqueous phase 7 containing ammonia is within an oil phase; and stirring and mixing together the feed micellar solution and the neutralizer micellar solution, according to the reverse-micelle method, thereby obtaining the titanium hydroxide compound particles 10 comprised of Ti $(OH)_4$.

Further, according to such manufacturing method, the solution of the silane compound is appropriately added to the mixed solution according to the sol-gel method, thus obtaining the silica-coated titanium hydroxide compound particles 12. After being separated from the mixed solution, the silica-coated titanium hydroxide compound particles 12 are washed and then dried, and subjected to baking treatment at the given temperature thereafter. In this way, according to such manufacturing method, there can be manufactured the titanium oxide particles 3 composed of the nanosized $Ti_3O_5$ particles 4 turned into $\lambda$ phase in a low-temperature range, and $\alpha$ phase in a high-temperature range. Further, the surfaces of the $Ti_3O_5$ particles 4 can be coated with the silica 5.

The titanium oxide particles 3 manufactured according to such manufacturing method are not phase-transited to $\beta$ phase having the property of a nonmagnetic semiconductor like the conventional crystals, even when the temperature is equal to or lower than 460K. As a matter of fact, such titanium oxide particles 3 are phase-transited to $\lambda$ phase that is a monoclinic crystal phase with which the paramagnetic metal state is maintained, thus allowing the titanium oxide particles 3 to keep exhibiting the paramagnetic metal property even in the low-temperature range equal to or lower than 460K.

In this sense, unlike the bulk bodies phase-transited between nonmagnetic semiconductors and paramagnetic metals around about 460K, there are provided titanium oxide particles 3 with an unprecedented property that the $Ti_3O_5$ particles 4 are capable of keeping exhibiting the paramagnetic metal property in all temperature ranges of 0-800K Further, such titanium oxide particles 3 are only comprised of Si and Ti which are highly safe and inexpensive, thus making it possible to provide the titanium oxide particles 3 with a low price, as a whole.

(5) Applications of Titanium Oxide Particles

Figure 12:
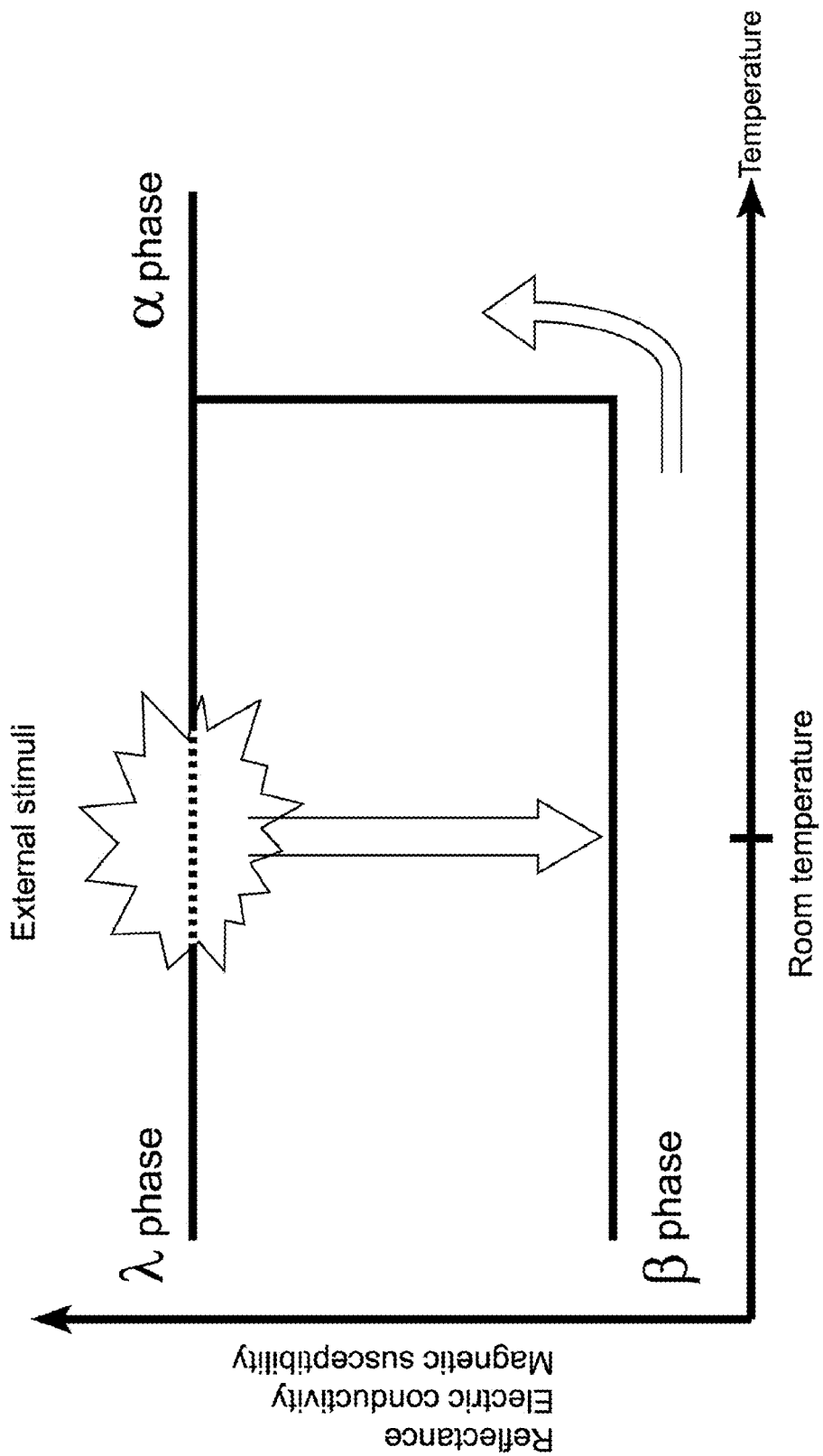
FIG. 12 is a graph explaining applications of the titanium oxide particles.

The aforementioned titanium oxide particles 3 can be used for the following purposes, based on an optical property, an electric conduction property and the magnetic property thereof. As shown in FIG. 12, the titanium oxide particles 3 of the present invention have crystal structures of $\lambda$ phase having the paramagnetic metal property, when the room temperature is below about 460K. Further, the crystal structures of the titanium oxide particles 3 are changed to those of $\beta$ phase having the property of a nonmagnetic semiconductor, when subjected to external stimuli such as lights, pressures, electromagnetic forces, magnetic fields or the like, thus allowing the magnetic property of the titanium oxide particles 3 to be changed.

Here, in FIG. 12, a horizontal axis represents the temperature, while a vertical axis represents magnetic susceptibility, electric conductivity or reflectance. According to the titanium oxide particles 3 of the present invention, the paramagnetic metal state thereof is maintained through out the low-temperature range and the high-temperature range, thus allowing the electric conductivities, the magnetic susceptibilities and the reflectances of the titanium oxide particles 3 to be maintained relatively high. In contrast, $\beta$ phase resulting from changes in the crystal structures due to the external stimuli has the property of a nonmagnetic semiconductor, thus causing the magnetic susceptibilities, the electric conductivities and the reflectances to become lower than those of $\alpha$ phase and $\lambda$ phase. In this sense, the electric conductivities, the magnetic susceptibilities and the reflectances of the titanium oxide particles 3 can be changed due to the external stimuli.

Further, even if the titanium oxide particles 3 are changed to $\beta$ phase when subjected to the external stimuli, the crystal structures of the titanium oxide particles 3 can be changed to those of $\alpha$ phase having the paramagnetic metal property by raising the temperature. Subsequently, as the temperature is lowered, the crystal structures of the titanium oxide particles 3 can be changed to those of $\lambda$ phase again from those of $\alpha$ phase. Accordingly, the titanium oxide particles 3 has a feature in which the crystal structures thereof are allowed to be changed from those of $\lambda$ phase to those of $\beta$ phase, and then from those of $\beta$ phase to those of $\alpha$ phase, and then from those of $\alpha$ phase to those of $\lambda$ phase again. Because of this feature, the titanium oxide particles 3 can be used in optical switching, magnetic memories and charge storage type memories or the like.

Recording media employing the titanium oxide particles 3 of the present invention are low in toxicity and can contribute to cost reduction, because there is used titanium oxide instead of substances such as germanium, antimony, tellurium or the like used in Blue-ray Discs.

Particularly, a given light serving as an external stimulus is applied to the titanium oxide particles 3 at the room temperature, thereby allowing the crystal structures thereof to change to those of $\beta$ phase with the property of a nonmagnetic semiconductor from those of $\lambda$ phase with the paramagnetic metal property, thus allowing the titanium oxide particles 3 to be used in optical switching.

Further, external stimuli such as lights, pressures, electromagnetic forces and magnetic fields are applied to the titanium oxide particles 3 at the room temperature, thereby allowing the crystal structures of the titanium oxide particles 3 to change to those of $\beta$ phase with the property of a nonmagnetic semiconductor from those of $\lambda$ phase with the paramagnetic metal property, thus allowing the titanium oxide particles 3 to be used in magnetic memories.

In fact, when used in magnetic memories, the titanium oxide particles 3 are employed as magnetic materials, and there is formed a magnetic layer obtained by fixing such magnetic materials on a supporting body. With regard to magnetic memories, external stimuli such as lights, pressures, electric fields and magnetic fields are applied thereto, thereby changing the magnetic property thereof by causing the crystal structures to change to $\beta$-$Ti_3O_5$ with the property of a nonmagnetic semiconductor from $\lambda$-$Ti_3O_5$ with the paramagnetic metal property, thus allowing information to be recorded. In this way, with regard to magnetic memories, stored information can be retrieved based on, for example, changes in the reflectance of a laser beam irradiated to the magnetic layer. Therefore, there can be provided a magnetic memory employing the titanium oxide particles 3 as the magnetic materials.

Further, when there are dispersed in an insulator the titanium oxide particles 3 having the crystal structures of either $\lambda$-$Ti_3O_5$ with the paramagnetic metal property or $\alpha$-$Ti_3O_5$ with the paramagnetic metal property, electric charges can be moved through the hopping conduction and the tunneling conduction due to the titanium oxide particles 3. Accordingly, the titanium oxide particles 3 can be used in a charge storage layer such as a floating gate of a charge storage type memory such as a flash memory or the like. Therefore, there can be provided a charge storage type memory employing a charge storage layer using the titanium oxide particles 3 as charge storage materials.

Furthermore, since the titanium oxide particles 3 have their own magnetic property and electric conduction property, there is obtained a new magnetoelectric (ME) effect, thus allowing the titanium oxide particles 3 to be used in technologies employing the ME effect. Furthermore, due to the coupling of the aforementioned optical property and electric conduction property, the titanium oxide particles 3 can also be used in fast switching effected by transient photocurrent.

(6) Other Examples

However, the present invention is not limited to the present example. As a matter of fact, various modified examples are possible within the scope of the gist of the present invention, as long as there can be manufactured the titanium oxide particles composed of the $Ti_3O_5$ particles whose paramagnetic metal state is maintained within the temperature range of 0-800K. For example, according to the aforementioned example, there are applied the titanium oxide particles 3 composed of the $Ti_3O_5$ particles 4 whose surfaces are coated with the silica 5. However, the present invention is not limited to this structure. Actually, there can also be applied titanium oxide particles composed of the $Ti_3O_5$ particles 4 whose surfaces are not coated with the silica 5.

As for a manufacturing method in this case, for example, there are first manufactured the titanium oxide particles 3 composed of the $Ti_3O_5$ particles 4 whose surfaces are coated with the silica 5, followed by stripping the silica 5 from the surfaces of the titanium oxide particles 3 by using, for example, a given solution such as dilute hydrofluoric acid or the like, thus obtaining the titanium oxide particles composed of only the $Ti_3O_5$ particles 4 whose surfaces are not coated with the silica 5.

EXAMPLE

An example in which there could be manufactured the aforementioned titanium oxide particles 3 is described hereunder in detail. In the beginning, cetyltrimethylammonium bromide of 7.2 g (20 mmol) was dissolved as a surfactant in 36 mL of octane, 7.2 mL of 1-butanol and 11.4 mL of water, followed by further dissolving titanium tetrachloride ($TiCl_4$) of 0.9 g (3 mmol) therein, thus obtaining a feed micellar solution.

Meanwhile, cetyltrimethylammonium bromide of 7.2 g (20 mmol) was dissolved as a surfactant in 36 mL of octane, 7.2 mL of 1-butanol and 7 mL of water, followed by mixing an ammonia water of 5 mL (66 mmol) as a neutralizer therein, thus obtaining a neutralizer micellar solution.

Next, there was prepared a mixed solution by adding such neutralizer micellar solution to such feed micellar solution, followed by leaving such mixed solution for reaction for about 30 minutes, thus obtaining the titanium hydroxide compound particles 10. Tetraethoxysilane (($C_2H_5O)_4Si$) of 5.6 g (27 mmol) was further added to this mixed solution, followed by leaving a mixed solution thus obtained for reaction for about 24 hours, thus obtaining the silica-coated titanium hydroxide compound particles 12 composed of the titanium hydroxide compound particles 10 whose surfaces are coated with silica ($SiO_2$) 8.

Further, the silica-coated titanium hydroxide compound particles 12 serving as precursors were extracted via separation, washing and drying, and were further powderized after being subjected to baking treatment for about five hours, in a hydrogen atmosphere (0.5 L/min) and at about 1200° C., thus obtaining a black heat-treated powder body.

There was obtained a TEM image shown in FIG.1 after photographing this heat-treated powder body with the transmission electron microscope (TEM). Further, there were obtained analysis results of XRD patterns similar to those shown in FIG.6 and FIG. 9 after performing XRD measurement on the heat-treated powder body by changing the temperature. Furthermore, there was obtained a result similar to the result shown in FIG.11 after measuring the magnetic susceptibility of the heat-treated powder body, using the magnetic fluxmeter employing SQUID.

The invention claimed is:

1. Titanium oxide particles composed of nanosized $Ti_3O_5$ particles comprised of $Ti_3O_5$, said titanium oxide particles maintaining a paramagnetic metal state in all temperature ranges of 0K (exclusive) to 800K (inclusive) and being not phase-transited to β phase having a property of a nonmagnetic semiconductor when a temperature is equal to or lower than 460K.

2. The titanium oxide particles according to claim 1, wherein said $Ti_3O_5$ particles form an orthorhombic crystal structure of α phase in said paramagnetic metal state within a temperature range not less than 500K, and a monoclinic crystal structure in said paramagnetic metal state within a temperature range not more than 300K.

3. The titanium oxide particles according to claim 2, wherein said $Ti_3O_5$ particles have surfaces thereof coated with silica.

4. The titanium oxide particles according to claim 3, wherein said $Ti_3O_5$ particles are manufactured in a manner such that a silane compound is added to a mixed solution prepared by mixing a feed micellar solution in which an aqueous phase containing titanium chloride is within an oil phase with a neutralizer micellar solution in which an aqueous phase containing a neutralizer is within an oil phase, thereby producing silica-coated titanium hydroxide compound particles obtained by allowing surfaces of titanium hydroxide compound particles in said mixed solution to be coated with silica, followed by separating said silica-coated titanium hydroxide compound particles from said mixed solution and then subjecting said silica-coated titanium hydroxide compound particles to baking treatment at a given temperature.

5. The titanium oxide particles according to claim 1, wherein said $Ti_3O_5$ particles have surfaces thereof coated with silica.

6. The titanium oxide particles according to claim 5, wherein said $Ti_3O_5$ particles are manufactured in a manner such that a silane compound is added to a mixed solution prepared by mixing a feed micellar solution in which an aqueous phase containing titanium chloride is within an oil phase with a neutralizer micellar solution in which an aqueous phase containing a neutralizer is within an oil phase, thereby producing silica-coated titanium hydroxide compound particles obtained by allowing surfaces of titanium hydroxide compound particles in said mixed solution to be coated with silica, followed by separating said silica-coated titanium hydroxide compound particles from said mixed solution and then subjecting said silica-coated titanium hydroxide compound particles to baking treatment at a given temperature.

7. The titanium oxide particles according to claim 1, wherein, within a temperature range equal to or lower than 300K, crystal structures of crystal phase in a paramagnetic metal state are changed to those of β phase having a property of a nonmagnetic semiconductor when subjected to lights or pressures as external stimuli.

8. The titanium oxide particles according to claim 7, wherein crystal structures of the β phase changed thereto when subjected to the external stimuli are changed to those of α phase having a paramagnetic metal property by raising a temperature.

9. The titanium oxide particles according to claim 8, wherein crystal structures of the α phase changed thereto are changed again to monoclinic crystal structures of crystal phase in a paramagnetic metal state as a temperature is lowered.

10. A magnetic memory comprising a magnetic layer formed by fixing magnetic materials on a supporting body, said magnetic materials being provided by using said titanium oxide particles according to any one of claims 1-9.

11. A charge storage type memory comprising a charge storage layer formed by fixing charge storage materials on a supporting body, said charge storage materials being provided by using the titanium oxide particles according to any one of claims 1-9.

* * * * *